US006912128B2

(12) United States Patent
Bird et al.

(10) Patent No.: US 6,912,128 B2
(45) Date of Patent: Jun. 28, 2005

(54) ELECTRONICS COOLING SUBASSEMBLY

(75) Inventors: John Bird, Newton, NH (US); Ralph I. Larson, Bolton, MA (US); Lyne Doré North, Chelmsford, MA (US); Paul Bussiere, Twin Mountain, NH (US); Amy Allen, Amesbury, MA (US)

(73) Assignee: Celestica International Inc., Toronto (CA)

(*) Notice: Subject to any disclaimer, the term of this patent is extended or adjusted under 35 U.S.C. 154(b) by 0 days.

(21) Appl. No.: 10/215,319

(22) Filed: Aug. 8, 2002

(65) Prior Publication Data
US 2003/0030980 A1 Feb. 13, 2003

Related U.S. Application Data
(60) Provisional application No. 60/311,214, filed on Aug. 9, 2001.

(51) Int. Cl.[7] .................................................. H05H 7/20
(52) U.S. Cl. ...................... 361/695; 165/80.3; 165/121; 165/122; 257/722; 361/697; 361/703
(58) Field of Search ............................... 165/80.2, 80.3, 165/185, 121–122, 126; 174/16.1, 16.3; 257/722; 361/687–688, 690, 694–697, 703, 719–720; 654/184

(56) References Cited

U.S. PATENT DOCUMENTS

| | | |
|---|---|---|
| 1,288,330 A | 12/1918 | White |
| 1,348,328 A | 8/1920 | Sonnenbor |
| 1,429,927 A | 9/1922 | Carter |
| 1,444,480 A | 2/1923 | Patch |
| 1,475,595 A | 11/1923 | Bingay |
| 1,571,300 A | 2/1926 | Reed |
| 1,631,711 A | 6/1927 | Treanor |
| 3,305,704 A | 2/1967 | Battista |
| 4,449,164 A * | 5/1984 | Carlson et al. ............. 361/694 |
| 4,469,269 A | 9/1984 | Ito et al. |
| 4,520,425 A | 5/1985 | Ito |
| 4,601,331 A | 7/1986 | Kessler, Jr. et al. |
| 4,745,960 A | 5/1988 | Karp |

(Continued)

FOREIGN PATENT DOCUMENTS

| | | |
|---|---|---|
| DE | 199 08 160.3 | 2/1999 |
| DE | 200 15 931.3 | 1/2001 |
| EP | 0 702 405 A1 | 3/1996 |
| EP | 0 817 555 A2 | 1/1998 |
| EP | 0998180 | 5/2000 |
| EP | 1117284 | 7/2001 |
| GB | 2 339 897 | 2/2000 |
| GB | 2 354 316 | 3/2001 |

OTHER PUBLICATIONS

EG & G Wakefield Engineering catalog of Series 200 heatsinks (Jun. 1985).
Drawing of Svetlana SK–2A Socket for use with Svetlana 3CX300A1 and forced air cooling (Jun. 2001).

*Primary Examiner*—Gregory Thompson
(74) *Attorney, Agent, or Firm*—Blake, Cassels & Graydon LLP; Terry L. Leier

(57) ABSTRACT

A thermo-electro sub-assembly comprises a gas supply, a first duct, a first heatsink adjacent a first device, a second duct, and a second heat sink adjacent a second device. The gas supply may be realized as a fan, a blower, or a compressed gas source. The first duct provides a passageway for delivering pressurized gas from the gas supply to the first heat sink. The duct may include a plurality of vanes for reducing the turbulence and air boundary separation within the duct. The first heatsink is in thermal communication with a first heat-producing device such as a microprocessor. In a preferred embodiment the heatsink comprises an axial shaped folded fin heatsink. The second duct is used to provide a pathway for the air leaving the first heatsink and delivers the air to the second heatsink. The second duct may also include a plurality of vanes for reducing turbulence and boundary flow separation within the second duct.

21 Claims, 3 Drawing Sheets

U.S. PATENT DOCUMENTS

| | | | |
|---|---|---|---|
| 5,077,601 A | * 12/1991 | Hatada et al. | ............... 361/695 |
| 5,107,398 A | 4/1992 | Bailey | |
| 5,132,780 A | 7/1992 | Higgins, III | |
| 5,218,514 A | 6/1993 | Huynh et al. | |
| 5,309,318 A | 5/1994 | Beilstein, Jr. et al. | |
| 5,570,740 A | 11/1996 | Flores et al. | |
| 5,597,035 A | 1/1997 | Smith et al. | |
| 5,640,046 A | * 6/1997 | Suzuki et al. | ................ 361/697 |
| 5,706,169 A | 1/1998 | Yeh | |
| 5,912,802 A | * 6/1999 | Nelson | ....................... 361/695 |
| 5,946,188 A | 8/1999 | Rochel et al. | |
| 6,021,042 A | * 2/2000 | Anderson et al. | ........... 361/695 |
| 6,021,844 A | 2/2000 | Butchelder | |
| 6,031,720 A | 2/2000 | Crane, Jr. et al. | |
| 6,034,871 A | 3/2000 | Cheng | |
| 6,034,873 A | 3/2000 | Stahl et al. | |
| 6,104,607 A | 8/2000 | Behl | |
| 6,113,485 A | 9/2000 | Marquis et al. | |
| 6,130,820 A | 10/2000 | Konstad et al. | |
| 6,145,586 A | 11/2000 | Lo | |
| 6,179,046 B1 | 1/2001 | Hwang et al. | |
| 6,199,624 B1 | 3/2001 | Wotring | |
| 6,230,789 B1 | 5/2001 | Pei et al. | |
| 6,330,154 B1 | * 12/2001 | Fryers et al. | ................ 361/695 |
| 6,401,807 B1 | * 6/2002 | Wyler et al. | ................. 165/121 |
| 6,442,024 B1 | * 8/2002 | Shih | ........................... 361/695 |

\* cited by examiner

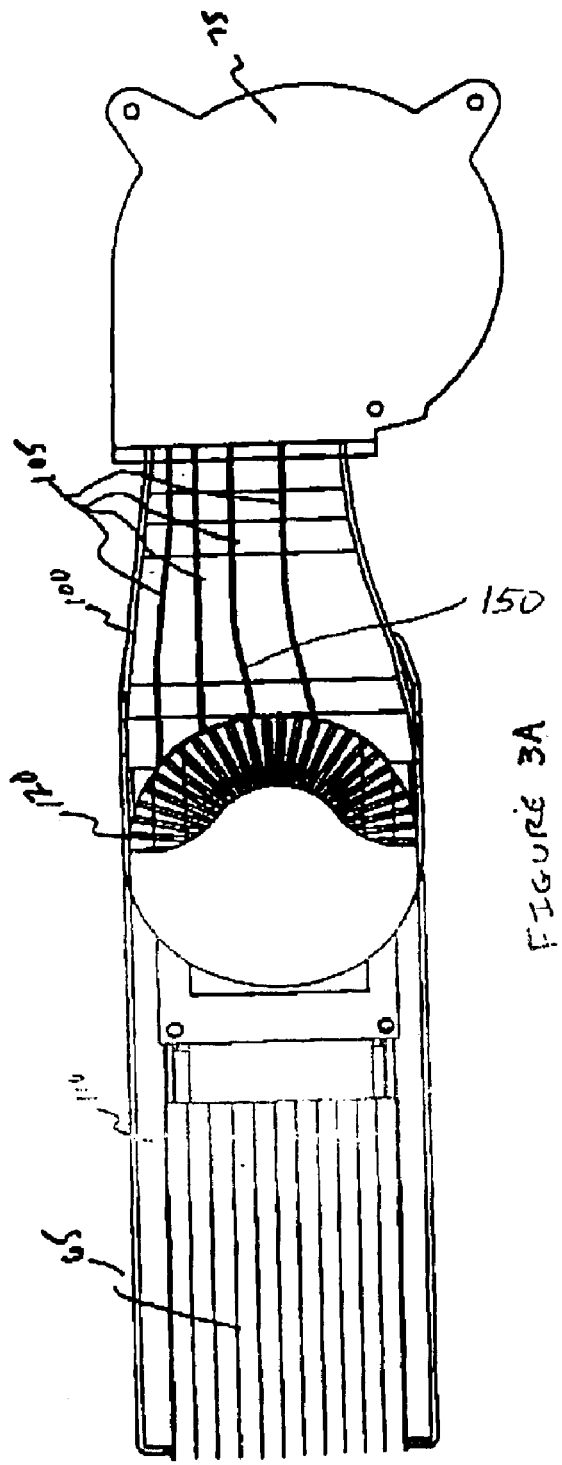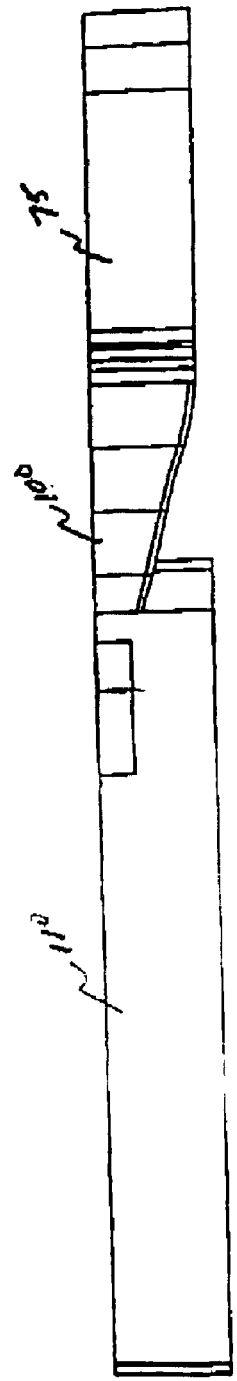
Figure 3A
Figure 3B

ELECTRONICS COOLING SUBASSEMBLY

CROSS REFERENCE TO RELATED APPLICATIONS

This application claims priority under 35 U.S.C. §119(e) to provisional patent application Ser. No. 60/311,214 filed Aug. 9, 2001; the disclosure of which is incorporated by reference herein.

STATEMENT REGARDING FEDERALLY SPONSORED RESEARCH

Not Applicable

FIELD OF THE INVENTION

The present invention relates generally to electronics cooling subassemblies and more particularly to electronics cooling subassemblies for use with integrated circuits (ICs) and printed circuit boards.

BACKGROUND OF THE INVENTION

As is known in the art, there is a trend to reduce the size of semiconductor devices, integrated circuits and microcircuit modules while at the same time having the devices, circuits and modules perform more functions. To achieve this size reduction and increased functionality, it is necessary to include a greater number of active circuits, such as transistors for example, in a given unit area. As a consequence of this increased functionality and dense packaging of active devices, such devices, circuits and modules (hereinafter collectively referred to as "circuits") use increasingly more power. Such power is typically dissipated as heat generated by the circuits.

This increased heat generation coupled with the need for circuits to have increasingly smaller sizes has led to an increase in the amount of heat generated in a given unit area. To further exacerbate the problem, the circuits are often densely mounted on printed circuit boards.

This increase in the amount of heat generated in a given unit area has led to a demand to increase the rate at which heat is transferred away from the circuits in order to prevent the circuits from becoming damaged or destroyed due to exposure to excessive heat. To increase the amount of heat which such circuits can withstand, the circuits can include internal heat pathways which channel or otherwise direct heat away from the most heat-sensitive regions of the circuits.

Although this internal heat pathway technique increases the amount of heat which the circuits can withstand while still operating, one problem with this internal heat pathway technique is that the amount of heat generated by the circuits themselves often can exceed the amount of self-generated heat which the circuits can successfully expel as they are caused to operate at higher powers. Furthermore, other heat generating circuit components mounted on printed circuit boards proximate the circuits of interest further increase the difficulty with which heat can be removed from heat sensitive circuits. Thus, to increase the rate at which heat is transferred away from the circuits, a heatsink is typically attached to the circuits.

Such heatsinks typically include a base from which project fins or pins. The fins or pins are typically provided by metal extrusion, stamping or other mechanical manufacturing techniques. The heatsinks conduct and radiate heat away from the heat generating and thermally vulnerable regions of circuits. To further promote the heat removal process, fans are typically disposed adjacent the heatsink to blow or otherwise force air or gas through the sides of the fins or pins of the heatsink.

One problem with this approach, however, is that the amount of air or other gas which a fan or blower can force through the heatsink fins/pins is limited due to the significant blockage of gas flow pathways due to the fins/pins themselves. Furthermore, in a densely populated printed circuit board (PCB) or multi-circuit module (MCM), other circuit components and mechanical structures required to provide or mount the PCB or module present additional blockage to gas pathways and also limits the amount of gas flow through the heatsink thus limiting the effectiveness of the heatsink. Thus, the ability of such conventional heatsinks and heatsink fan assemblies is limited and is not sufficient to remove heat as rapidly as necessary to ensure reliable operation of state of the art devices, circuits and modules having increased thermal cooling requirements.

It would, therefore, be desirable to provide a heat removal system which is capable of removing an amount of heat which is greater than the amount of heat removed by conventional heatsinks. Additionally, it would be desirable to provide Electro-Magnetic Interference (EMI) protection in conjunction with the removal of heat from semiconductor devices, integrated circuits and microcircuit modules.

SUMMARY OF THE INVENTION

In accordance with the present invention, an electronics cooling sub-assembly comprises a gas supply, a first duct, a first heatsink adjacent a first device, a second duct, and a second heat sink adjacent a second device. The gas supply may be realized as a fan, a blower, a compressed gas supply or other gas source. The first duct provides a passageway for delivering high velocity gas from the gas supply to the first heat sink. The first duct may include a plurality of vanes for reducing the turbulence and air boundary separation within the duct. The first heatsink is in thermal communication with a first heat-producing device such as a microprocessor. In a preferred embodiment the heatsink comprises an axial shaped folded fin heatsink. The second duct is used to provide a pathway for the air leaving the first heatsink and delivers the air to the second heatsink. The second duct may also include a plurality of vanes for reducing turbulence and boundary flow separation within the second duct. The second heatsink is disposed adjacent a second device such as a circuit which provides power to the first device. The second heatsink may be realized as a folded fin linear heatsink, and the gas delivered by the second duct is directed over the linear arrangement of fins. The ducts, in a preferred embodiment are used to provide EMI protection. The ducts are made of a conductive material or of a non-conductive material which has a conductive coating. By electrically connecting the ducts to ground, the ducts perform as an EMI shield.

BRIEF DESCRIPTION OF THE DRAWINGS

The invention will be more fully understood from the following detailed description taken in conjunction with the accompanying drawings, in which:

FIG. 3A is a partially cut-away top view of the thermo-electro sub-assembly of the present invention; and FIG. 3B is a side view of the thermo-electro sub-assembly of the present invention.

DETAILED DESCRIPTION OF THE INVENTION

Figure 1:
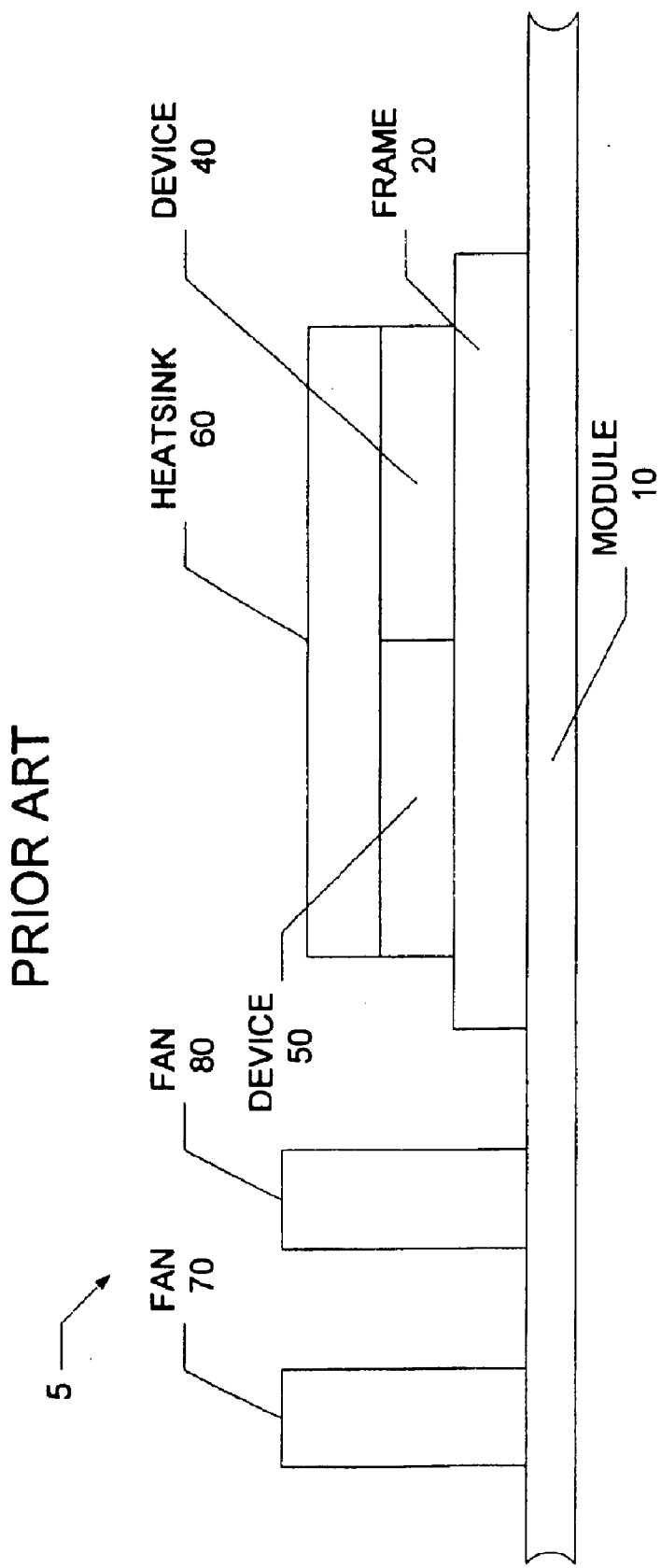
FIG. 1 is a side view of a prior art heat removal assembly.
Figure 2:
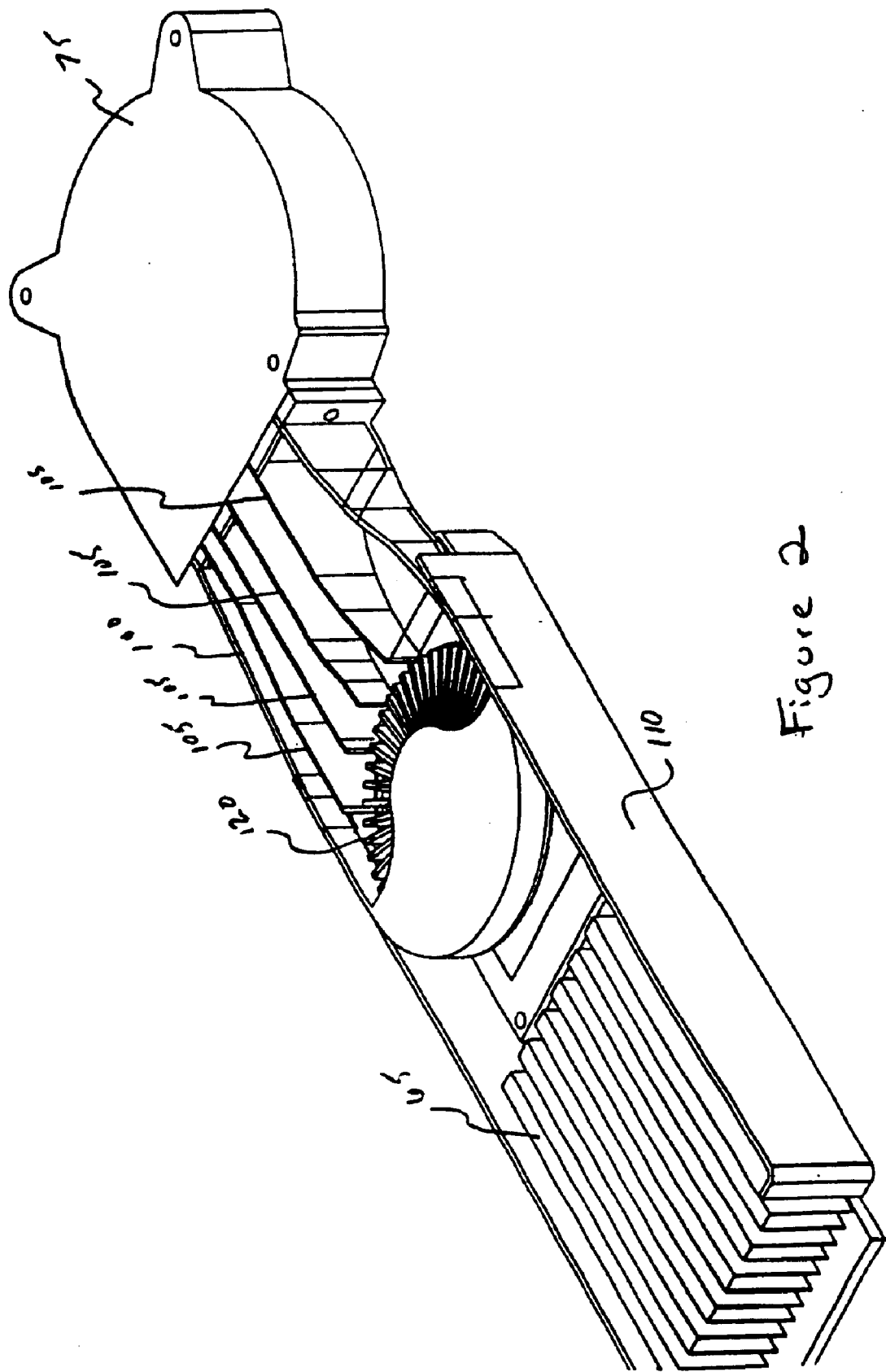
FIG. 2 is a partially cut-away isometric view of the thermo-electro sub-assembly of the present invention.

Referring now to FIGS. 1–3B in which like elements are provided having like reference designations throughout the several views, a prior art heat removal system is shown in FIG. 1, and the electronics cooling sub-assembly of the present invention is shown in FIGS. 2–3B.

As shown in FIG. 1, a prior art heat removal assembly 5 comprises a heatsink 60 coupled to a first heat producing device 50 and a second heat-producing device 40. A frame 20 is used to mount the first and second device to a module 10. In order to cool the devices 40 and 50 a pair of fans 70 and 80 are used. Fan 70 is disposed to direct an air stream to fan 80, which directs its air stream across heat sink 60. Heat sink 60 is a linear heatsink. This embodiment requires a significant amount of height, and is therefore not usable in many enclosures. Also, the heatsink 60 is a large, heavy component which has high costs associated with it. Further there is no EMI protection afforded the two devices by this configuration.

Referring now to FIGS. 2–3B, the present invention is shown. The presently disclosed electronics cooling sub-assembly utilizes a gas supply 75, which is located remotely from the devices being cooled. The gas supply may be realized as a fan, a blower or a compressed air source. In a preferred embodiment, the gas supply comprises a "squirrel cage" type blower. A first duct 100 is coupled to the portion of the blower exhaust port which has the high velocity airflow exiting. First duct 100 provides a passageway for the gas flow from the blower to the first heatsink 120. A second duct provides a passageway for gas flow from the first heatsink 120 to second heatsink 65.

Duct 100 includes a plurality of vanes 105 disposed therein. The vanes 105 are designed to reduce the turbulence within the first duct 100, prevent or reduce air boundary separation within the duct, and to maintain the velocity head pressure. The vanes minimize the discontinuities in the airflow through the duct. As a result, a high pressure, generally uniform stream of gas is provided by the first duct 100 to a first heatsink 120. The vanes are preferably solid pieces having a smooth finish in order to minimize turbulence. Transition vanes 150 may also be incorporated at the end of the duct 100.

As shown in FIGS. 2–3B duct 100 is coupled to gas supply 75. The gas velocity coming out of the gas supply 75 is non-uniform across the output of the gas supply 75. Accordingly, the duct 100 should be carefully matched to the fan to prevent large pressure drops from occurring. The incorporation of vanes 105 within the duct 100 keep the gas flow attached, thus the separation and turbulence are minimized as is the loss of velocity head pressure. The duct 100 and vanes 105 allow the gas flow from gas supply 75 to become evenly distributed, therefore making the useable output of the gas mover as large as possible.

Duct 100 may be provided in any desired shape as long as the duct provides a passageway for the gas exiting the gas supply 75 to the first heatsink. The vanes 105 may be provided having any shape which prevents or reduces flow separation of the gas within the duct. The particular shape of the duct and the vanes will be selected in any particular application in accordance with a variety of factors including but not limited to the amount of gas flow being utilized, the size of the device being cooled and the amount of cooling required to cool the particular device. The vanes may also be configured to reduce the spin of the gas flow discharged from a propeller fan.

In an exemplary embodiment, the first heatsink 120 is provided having a substantially circular shape, other shapes, including, but not limited to, rectangular, circular, oval, square, triangular, rhomboidal and irregular shapes, may also be used. The particular shape of the heatsink will be selected in any particular application in accordance with a variety of factors including but not limited to the shape of the particular part being cooled and the amount of area available for mounting of the heat sink. The first heatsink 120 may further be realized as a folded fin heatsink. First heatsink 120 is thermally coupled to a first device, and provides for removal of heat from the first device. In a preferred embodiment, the first device comprises a microprocessor. In a preferred embodiment the first heatsink is provided having a plurality of ridges and troughs which define a plurality of spaced fins. A sidewall of the fin includes at least one aperture extending through the sidewall. The plurality of apertures are provided in a predetermined pattern, shape and size to provide the desired cooling. The top edges of the fins are closed, and the bottom edges of the troughs are also closed, thereby allowing the fin/trough combination to act as a plenum.

The apertures can be of any size or shape. Additionally, the material originally in the side wall where the aperture is may not be completely removed, but merely bent displaced from the sidewall. This arrangement provides additional material for cooling as opposed to the embodiment wherein the original material in the sidewall is completely removed to form the aperture. Additionally, the portion displaced from the sidewall provides increased turbulence which breaks up boundary layers, thereby providing additional cooling.

The heat sink may further include a thermally conductive member. A first surface of the member is adapted to be in contact with an active portion of a heat generating device (e.g. an integrated circuit). Thus the folded fin stock is wrapped around the member and is in thermal communication with the member. Typically, the folded fin stock and member are provided from tinned copper or aluminum.

Ideally, the portion of the member in contact with the heat generating device is provided having a shape which covers as much as possible the active area of the first heat generating device. In one embodiment, the member is machined flat and a thermal interface material is disposed on the surface of the member which will be in contact with the first heat generating device. Thus, for example, in the case where the first heat generating device is an IC which itself includes an internal heat sink, the member should cover the internal heat sink of the IC.

Also, it may be desirable or necessary to provide folded fin members of the heatsink as a single unitary piece or as more than one piece. The particular number of pieces from which the first heatsink is provided may be selected in accordance with a variety of factors including but not limited to the particular application, the amount of heat which must be transferred away from heat generating devices, the amount of space available for mounting of the heat sink and other components, the particular material from which the heatsink pieces is provided, the particular manufacturing techniques used to fabricate heatsink and the cost of manufacturing the heatsink.

A second duct 110 is coupled adjacent first duct 100 and is utilized to provide gas exiting first heatsink 120 to second heatsink 65. Second duct 110 may also include a plurality of vanes disposed therein to reduce or eliminate turbulence and boundary flow separation. In a preferred embodiment there are two ducts, though the ducts could be combined into a single unitary duct.

Second duct 110 may be provided in any desired shape as long as the duct provides a passageway for the gas exiting the first heatsink to the second heatsink. The particular shape of the duct will be selected in any particular application in accordance with a variety of factors including but not limited to the amount of gas flow being utilized, the size of the device being cooled and the amount of cooling required to cool the particular device.

Second heatsink 65 in a preferred embodiment is linear heatsink and is coupled to a second device. While second heatsink 65 is shown having a generally rectangular shape, other shapes could also be used. Second heatsink 65 may also be realized as a folded fin heatsink. The second device may be a device which provides power to the first heat generating device.

The heatsinks may be coupled to any type of integrated circuit package including, but not limited to, dual-in-line packages (DIP) leadless chip carriers, leaded chip carriers, flat packs, pin-grid arrays as well as other surface mount packages and small outline integrated circuit packages for surface-mounting.

One or both of the heatsinks as shown and described herein may be disposed over a first surface of one or more integrated circuits which are disposed on a printed circuit board. Disposed between a first surface of a circuit and a first surface of a particular heatsink is a sheet of a thermally conductive matrix material. The matrix material facilitates an extraction of heat from the circuit to the heatsink.

It should also be noted that in some applications it might be desirable to mount the circuit on the printed circuit board prior to placing the heatsink/thermally conductive matrix material assembly on to the circuit. It should also be noted that in some applications it might be desirable to apply the thermally conductive matrix material first to the surface of the circuit and then to mount the heatsink to the circuit/thermally conductive matrix assembly and then mount the assembly on the PCB.

The present invention solves the problem of providing heat removal for a device that must be fit into a small space, unlike the prior art solutions. The typical size of a box that fits into a rack is known as a "U" which is equal to about 1.75 inches in height. Presently, there exist needs for cooling solutions which fit within a 1U, 2U, 3U and 4U box. The present invention fits within a 1U box and can be implemented on a top side of a module and on a bottom side of a module within a 2U or bigger box.

Having described the preferred embodiments of the invention, it will now become apparent to one of ordinary skill in the art that other embodiments incorporating their concepts may be used. It is felt therefore that these embodiments should not be limited to disclosed embodiments but rather should be limited only by the spirit and scope of the appended claims. All publications and references cited herein are expressly incorporated herein by reference in their entirety.

What is claimed is:

1. An electronics cooling subsystem comprising:
a first heatsink capable of being thermally coupled to a first heat producing device;
a first duct having a first end and a second end, the first end of said first duct capable of being coupled to a gas supply remotely located from said first heatsink, the second end disposed adjacent said first heatsink, and a first plurality of vanes disposed within said first duct, said first plurality of vanes arranged to reduce turbulence and to reduce airflow separation within said first duct;
a second heatsink capable of being thermally coupled to a second heat producing device; and
a second duct having a first end and a second end, the first end of said second duct capable of being coupled to said second end of the first duct about at least a portion of said first heatsink, the second end of said second duct disposed adjacent said second heatsink.

2. The electronics cooling subsystem of claim 1 further comprising a gas supply coupled to the first end of said first duct and wherein said supply is selected from the group consisting of a fan, a blower, and a compressed gas supply.

3. The electronics cooling subsystem of claim 1 wherein said second duct includes a second plurality of vanes disposed within said second duct, said second plurality of vanes arranged to reduce turbulence and to reduce airflow separation within said second duct.

4. The electronics cooling subsystem of claim 1 wherein said first heatsink comprises an axial heatsink.

5. The electronics cooling subsystem of claim 1 wherein said first heatsink comprises a folded fin heatsink.

6. The electronics cooling subsystem of claim 1 wherein said first duct further comprises at least one transition vane at the second end of said first duct.

7. The electronics cooling subsystem of claim 1 wherein said first duct is comprised of a material selected from the group consisting of electrically conductive material, and non-electrically conductive material having a conductive coating over at least a part thereof.

8. The electronics cooling subsystem of claim 1 wherein said second duct is comprised of a material selected from the group consisting of electrically conductive material, and non-electrically conductive material having a conductive coating over at least a part thereof.

9. The electronics cooling subsystem of claim 1 wherein said second heatsink comprises a linear heatsink.

10. The electronics cooling subsystem of claim 1 wherein said first plurality of vanes are solid.

11. The electronics cooling subsystem of claim 1 wherein said first plurality of vanes have a smooth finish.

12. The electronics cooling subsystem of claim 3 wherein said second plurality of vanes are solid.

13. The electronics cooling subsystem of claim 3 wherein said second plurality of vanes have a smooth finish.

14. The electronics cooling subsystem of claim 1 wherein said first duct comprises an EMI shield.

15. The electronics cooling subsystem of claim 1 wherein said second duct comprises an EMI shield.

16. The electronics cooling subsystem of claim 1 wherein said first duct is in electrical communication with a ground reference.

17. The electronics cooling subsystem of claim 1 wherein said second duct is in electrical communication with a ground reference.

18. The electronics cooling subsystem of claim 1 wherein said first heat producing device comprises an integrated circuit.

19. The electronics cooling device of claim 1 wherein said second heat producing device comprises a power delivery device.

20. An electronics cooling sub-system as claimed in claim 1, in which the first end of said second duct is arranged to receive gas from the gas supply which has exited the second end of the first duct and which has contacted the first heatsink to absorb heat therefrom.

21. An electronics cooling subsystem comprising:

a heatsink capable of being thermally coupled to a first heat producing device;

a duct having a first end and a second end, the first end of said duct capable of being coupled to a gas supply remotely located from said heatsink, the second end of said duct disposed adjacent said heatsink, and a plurality of vanes disposed within said duct, said plurality of vanes arranged to reduce turbulence and to reduce airflow separation within said duct, said plurality of vanes extending along a majority of a longitudinal length of said duct, and said duct being in electrical communication with a ground reference.

* * * * *